United States Patent
Cho et al.

(10) Patent No.: US 6,720,276 B2
(45) Date of Patent: Apr. 13, 2004

(54) METHODS OF FORMING SPIN ON GLASS LAYERS BY CURING REMAINING PORTIONS THEREOF

(75) Inventors: Min-hee Cho, Kyungki-do (KR); Chang-hyun Cho, Seoul (KR); Soo-ho Shin, Seoul (KR); Hong-sik Jeong, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/060,486

(22) Filed: Jan. 30, 2002

(65) Prior Publication Data

US 2002/0111032 A1 Aug. 15, 2002

(30) Foreign Application Priority Data

Feb. 13, 2001 (KR) .......................................... 2001-6985

(51) Int. Cl.$^7$ ................................................ H01L 21/31
(52) U.S. Cl. .................. 438/789; 438/779; 438/780; 438/782; 438/789
(58) Field of Search .................. 438/779, 780, 438/781, 782, 789

(56) References Cited

FOREIGN PATENT DOCUMENTS

| KR | 1996-035818 | 10/1996 | ........... H01L/21/28 |
| KR | 1996-035821 | 10/1996 | ........... H01L/21/28 |

OTHER PUBLICATIONS

Notice to Submit Response for Korean Application 10-2001-0006985; Jan. 24, 2003.

*Primary Examiner*—Evan Pert
*Assistant Examiner*—Lisa Kilday
(74) *Attorney, Agent, or Firm*—Myers Bigel Sibley & Sajovec, P.A.

(57) ABSTRACT

Methods of forming a spin-on-glass (SOG) layer are disclosed. An SOG layer is formed on an integrated circuit substrate. A first curing process is performed on the SOG layer. Less than all of the SOG layer is removed from the integrated circuit substrate through a mask pattern on the SOG layer to provide a remaining portion of the SOG layer on the integrated circuit substrate. A second curing process is performed on the SOG layer. The remaining portion of the SOG layer is removed to expose the integrated circuit substrate.

14 Claims, 3 Drawing Sheets

METHODS OF FORMING SPIN ON GLASS LAYERS BY CURING REMAINING PORTIONS THEREOF

CLAIM FOR PRIORITY

This application claims priority to Korean Patent Application No. 2001-6985, filed Feb. 13, 2001, the disclosure of which is hereby incorporated herein by reference.

FIELD OF THE INVENTION

The invention relates to methods of forming integrated circuits, and more particularly, to methods of forming integrated circuits having spin-on-glass layers.

BACKGROUND OF THE INVENTION

As techniques of manufacturing semiconductor devices develop, the integration density of semiconductor devices may increase and, associated design rules for forming the semiconductor device may decrease. Accordingly, the distance between adjacent conductive layers on the same layer can decrease and thus, the aspect ratio of the height of a gap between adjacent conductive layers to the width of the gap between adjacent conductive layers increases. Therefore, a method of filling the gap between conductive layers having high aspect ratios may be useful.

It is know to use a Boron Phosphorus Silicate Glass (BPSG) layer and a high density plasma (HDP) oxide layer as an interlayer dielectric layer to fill the gaps discussed above. However, in the case of using the BPSG layer, a temperature of 800° C. or greater may be needed. In the case of using the HDP oxide layer, if the aspect ratio is greater than 2.5, the gap filling capability of the HDP oxide layer may be considerably diminished.

It is known to use a Spin-On-Glass (SOG) layer as an interlayer dielectric layer instead of the BPSG layer and the HDP oxide layer discussed above. The SOG layer exists in a liquid state at room temperature and thus, can exhibit superior gap filling capability if it is densified through a curing process.

FIGS. 1 and 2 are cross-sectional diagrams illustrating a method of patterning a conventional SOG layer. Referring to FIG. 1, a semiconductor substrate 10 on which a predetermined pattern has been formed is coated with a SOG layer 12. Next, the SOG layer 12 is cured to be densified. However, the lower part of the SOG layer 12 is susceptible to insufficient densification by curing. The lower part of the SOG layer 12, which is not sufficiently densified, may exhibit inferior gap filling characteristics in the subsequent cleaning process, which will be described in detail below.

A hard mask material is deposited on the SOG layer 12 and then, a hard mask pattern 14 is formed by using photolithography and etching. After that, the SOG layer 12 is etched using the hard mask pattern 14 as an etching mask so that a predetermined portion of the semiconductor substrate 10 can be exposed. Referring to FIG. 2, the exposed portions of the semiconductor substrate 10 are cleaned to reduce a contact resistance between the semiconductor substrate 10 and a pad or a contact plug. In the cleaning process, standard cleaning 1 cleaner (mixed liquid of ammonium hydroxide, peroxide and deionized water) can be used. The lower part of the SOG layer 12a, which was not sufficiently cured, can be etched more rapidly than the upper part of the SOG layer 12b which was sufficiently cured.

As described above, the SOG can exhibit the problem in that its lower part is not sufficiently cured. Due to this phenomenon, the profile of a SOG layer pattern may become deteriorated in a subsequent cleaning process as shown by the erratic profile of the layer 12a. In some extreme situations, the lower part of the SOG layer 12a may be completely removed, thereby possibly completely destroying the SOG layer pattern. In addition, if the SOG layer is not satisfactorily cured, it may exhibit hydroscopic and outgasing characteristics. These characteristics can bring about contact failure introduced by a deteriorated contact profile and oxidation of metal interconnections caused by absorption of moisture or outgasing.

SUMMARY OF THE INVENTION

Embodiments according to the invention can provide methods of forming a Spin-On-Glass (SOG) layer. Pursuant to these embodiments, an SOG layer is formed on an integrated circuit substrate. A first curing process is performed on the SOG layer. Less than all of the SOG layer is removed from the integrated circuit substrate through a mask pattern on the SOG layer to provide a remaining portion of the SOG layer on the integrated circuit substrate. A second curing process is performed on the SOG layer. The remaining portion of the SOG layer is removed to expose the integrated circuit substrate.

In some embodiments according to the invention, the SOG layer is etched through the mask pattern to form a recess in the SOG layer, wherein the recess has a bottom formed of the SOG layer that is spaced-apart from the integrated circuit substrate by a thickness of the bottom.

In some embodiments according to the invention, etching the bottom is followed by cleaning the integrated circuit substrate and forming a conductive layer in the recess on the integrated circuit substrate.

In some embodiments according to the invention, performing the first curing process includes performing the first curing process at a temperature in a range between about 600° C. and about 800° C. for a time in a range between about 20 minutes and about 2 hours.

In some embodiments according to the invention, performing the second curing process includes performing the second curing process at a temperature in a range between about 400° C. and about 800° C. for a time in a range between about 10 minutes and about 1 hour.

In some embodiments according to the invention, the first and second curing processes are performed using $H_2O$, $O_2$, $N_2$, $H_2$, $NO_2$ or a mixture of these gases as an atmospheric gas.

In some embodiments according to the invention, the remaining portion has a thickness that is adequate to prevent oxidation of the integrated circuit substrate during the second curing process. In some embodiments according to the invention, the thickness is in a range between about 300 Ångstroms and about 500 Ångstroms.

In some embodiments according to the invention, the etching is performed using a C—F based gas, CO gas, $O_2$ gas and an inert gas as etching gas, reaction gas and atmospheric gas, respectively. In some embodiments according to the invention, the etching is performed at an RF power in a range between about 1000 Watts and about 2000 Watts at a pressure in a range between about 10 mTorr and about 100 mTorr and a temperature in a range between about 0° C. and about 60° C. for a time in a range between about 20 seconds and about 50 seconds.

In some embodiments according to the invention, the etching is performed using at an RF power in a range between about 1000 Watts and about 2000 Watts at a pressure in a range between about 10 mTorr and about 100 mTorr and a temperature in a range between about 0° C. and about 60° C. for a time in a range between about 5 second and about 30 seconds.

In some embodiments according to the invention, the mask pattern is formed of a polysilicon layer, an aluminum oxide layer ($Al_2O_3$), an aluminum nitride layer (AlN) or a silicon nitride layer ($Si_3N_4$).

DETAILED DESCRIPTION OF EMBODIMENTS ACCORDING TO THE INVENTION

Figure 1:
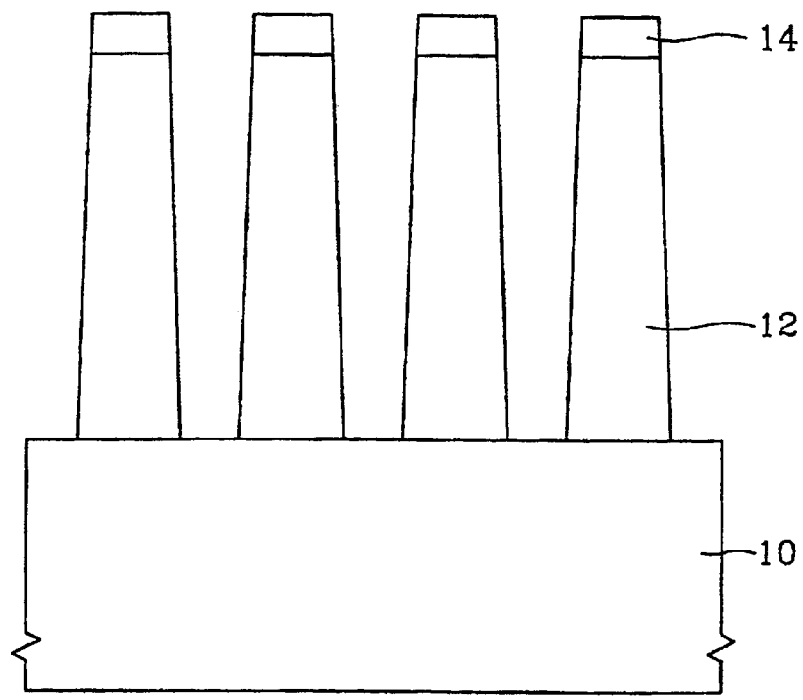
FIGS. 1 and 2 are cross-sectional views illustrating a conventional method of patterning a spin-on-glass layer.
Figure 2:
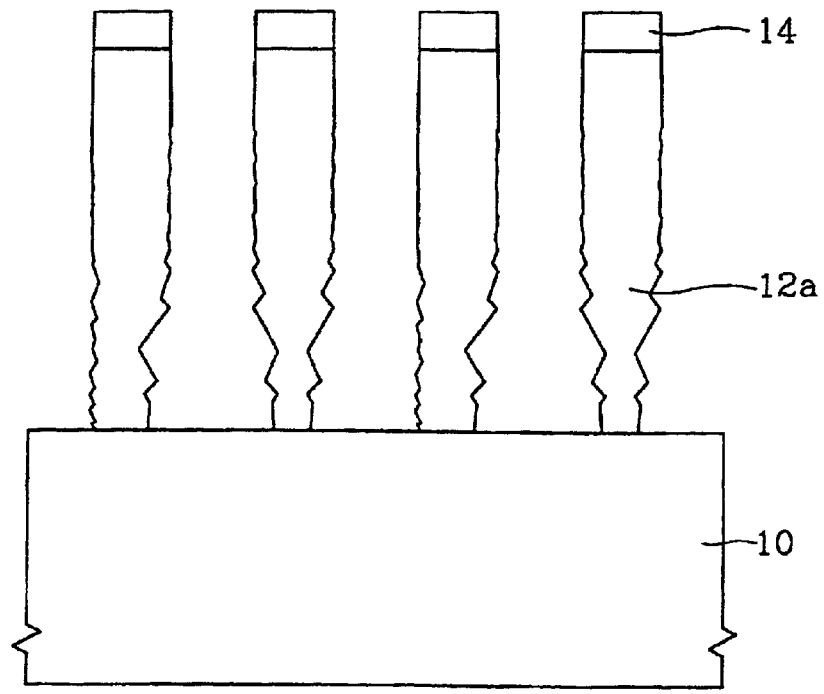

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the relative sizes of regions may be exaggerated for clarity. It will be understood that when an element such as a layer, region, portion, or substrate is referred to as being "on" another element, it can be directly on the other element or intervening elements may also be present. In contrast, when an element is referred to as being "directly on" another element, there are no intervening elements present. The terms used herein are to be given their ordinary meaning unless explicitly defined otherwise herein.

Figure 3:
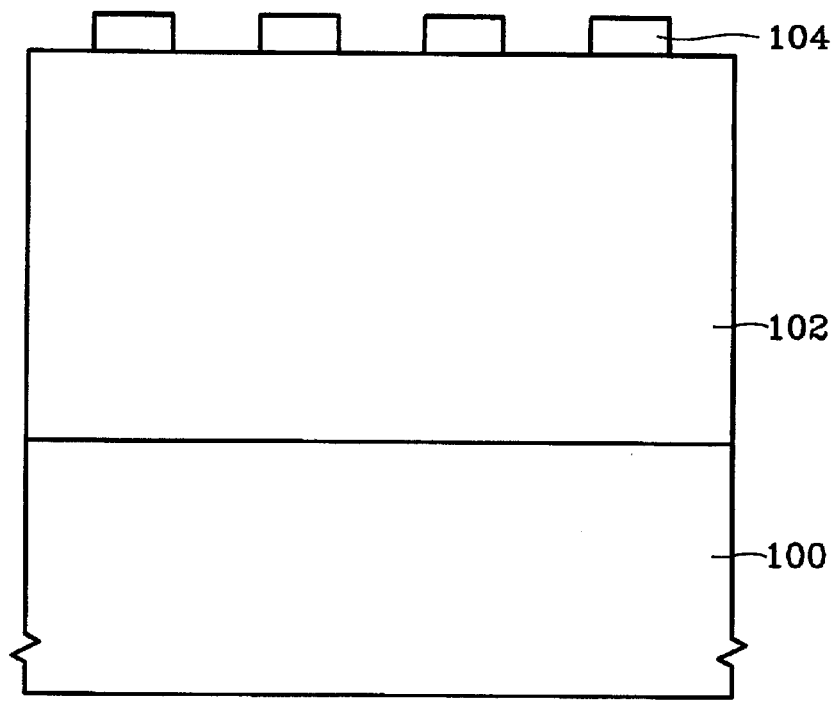
FIGS. 3 through 6 are cross-sectional views illustrating method embodiments of forming integrated circuits including a spin-on-glass layer according to the present invention.

Referring to FIG. 3, an integrated (semiconductor) substrate 100, on which a pattern (not shown) has been formed, is coated with a Spin-On-Glass (SOG) layer 102. The pattern may be a gate electrode, a bit line electrode or a metal interconnection. Here, a stopper layer (not shown) may be formed on the integrated circuit substrate 100 with the predetermined pattern. In some embodiments according to the invention, the stopper layer has the SOG layer 102 thereon. In some embodiments according to the invention, the stopper layer is formed of a silicon nitride layer $Si_3N_4$, an aluminum oxide layer $Al_2O_3$, an aluminum nitride layer AlN, a titanium nitride layer TiN or a tantalum nitride layer TaN. In some embodiments according to the invention, organic or inorganic SOG materials such as silicate, siloxan or hydrogen silsesquioxane can be used to form the SOG layer 102. Other materials can be used for the SOG layer 102. The SOG layer 102 can have a viscosity of 1.5 to 1.9 and exists in a liquid state at room temperature.

The integrated circuit substrate 100 is coated with the SOG layer 102 in a spin coating manner or using other techniques known to those having skill in the art. In some embodiments according to the invention, a rotating wafer (including the integrated circuit substrate 100) is coated with the SOG layer 102 by applying a predetermined amount of SOG material on the rotating wafer using, for example, a dispenser. The wafer can be rotated (on a spin cotter) at a speed in a range between about 1000 rpm and about 4000 rpm. The spin coating process can be repeated at least two times depending on the thickness of the SOG layer 102 to be formed, the viscosity of the SOG layer 102 and the speed of the spin cotter. As the SOG layer 102 exists in a liquid state at room temperature, it can provide good gap filling capability.

Next, a first curing process is performed to densify the SOG layer 102. Preferably, the first curing process is performed at a temperature in a range between about 600° C. and about 800° C. for a time in range between about 20 minutes and about 2 hours. The first curing can be carrier out in an atmosphere of a gas, such as, $H_2O$, $O_2$, $N_2$, $H_2$, $NO_2$ or a mixture of these gases. Preferably, $H_2O$ and $O_2$ are used.

A hard mask pattern 104 is formed on the SOG layer 102 by performing a photolithography process and an etching process. In some embodiments according to the invention, the material for a hard mask is a polysilicon layer, an aluminum oxide layer ($Al_2O_3$), an aluminum nitride layer (AlN) or a silicon nitride layer ($Si_3N_4$).

Figure 4:
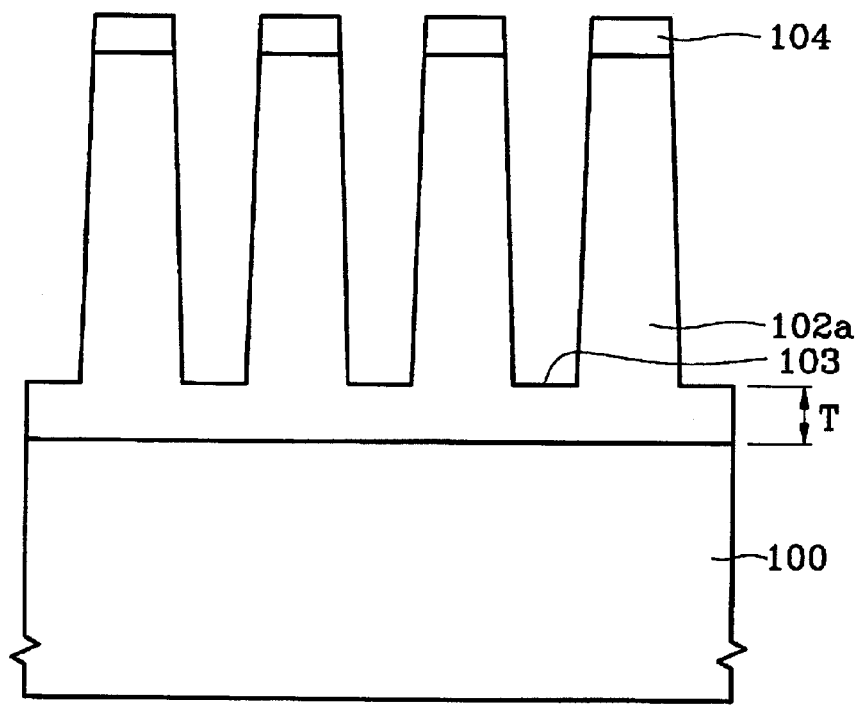

Referring to FIG. 4, the SOG layer 102 is etched using the hard mask pattern 104 as a mask, to form a recess in the SOG layer 102 to expose a lower portion of the SOG layer 102a, but not expose the integrated circuit substrate 100. The recess is defined by a bottom of the SOG layer 103. Preferably, the bottom 103 is spaced-apart from the integrated circuit substrate 100 (or another layer between the integrated circuit substrate 100 and the bottom 103) by a thickness T. The thickness T of the bottom 103 can act as a protection layer to prevent oxidation of the integrated circuit substrate 100 during a second curing process. In some embodiments according to the invention, the lower portion of the bottom 103 is etched to a thickness in a range between about 300 Ångstroms and about 500 Ångstroms on the surface of the integrated circuit substrate 100 and to remain on the integrated circuit substrate 100. In other words, the recess is etched to avoid exposing the substrate by not completely removing from the SOG layer 102.

The etching can be performed using C—F based gas, such as $C_5F_8$ or $C_4F_8$ or carbon monoxide (CO) gas, with $O_2$ gas and an inert gas, such as Ar. Preferably, the etching process is performed at an RF power in a range about 1000 Watts and about 2000 Watts at a pressure in a range between about 10 mTorr and about 100 mTorr and a temperature in a range between about 0° C. and about 60° C., for a time in a range between about 20 seconds and about 50 seconds, and preferably, for about 30 seconds.

If the etching process is performed not to leave the lower portion of the SOG layer 102a on the substrate, and a second curing process is performed on the resultant structure, a thick oxide layer may be formed on the exposed portion of the integrated circuit substrate 100, that is, a silicon substrate.

Figure 5:
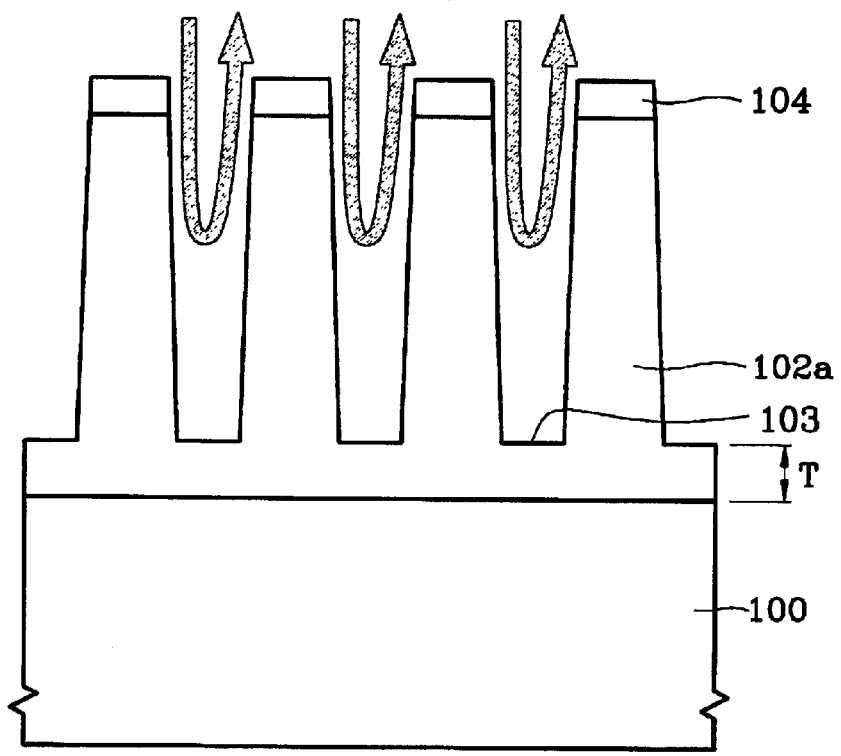

Referring to FIG. 5, a second curing process is performed to densify the lower portion of the SOG layer 102a. The arrows shown in FIG. 5 are used to denote the second curing process performed on the lower portion of the SOG layer 102a. Preferably, the second curing process is performed at a temperature in a range between about of 400° C. and about 800° C. for about 10 minutes to one hour. At this time, preferably, $H_2O$, $O_2$, $N_2$, $H_2$, $NO_2$ or a mixture of these gases is used as atmospheric gas and more preferably, $H_2O$ and $O_2$ are used.

Figure 6:
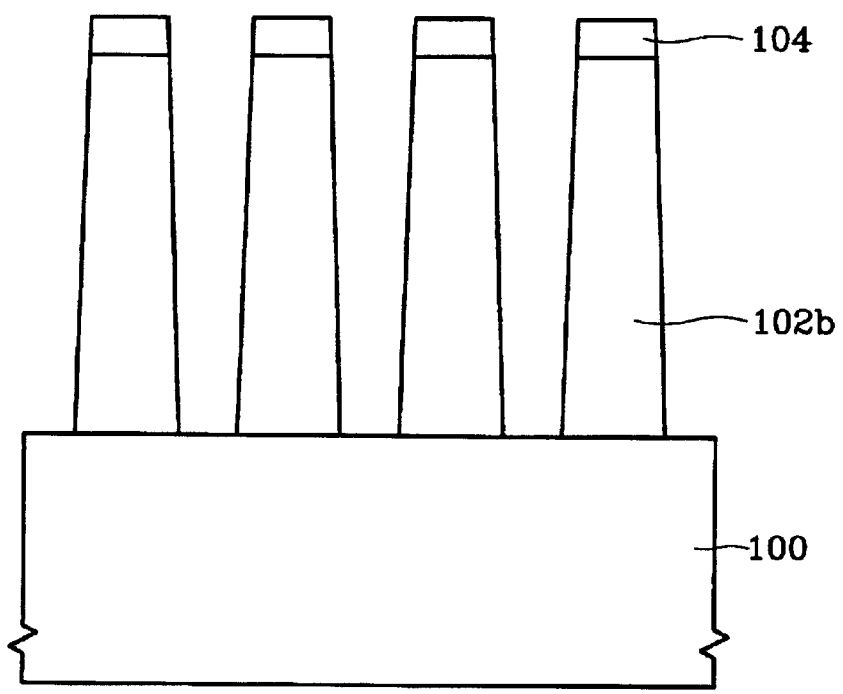

Referring to FIG. 6, the remaining lower portion of the SOG layer 102a is removed by etching using the hard mask pattern 104 as a mask. In some embodiments according to the invention, the etching is performed using a C—F based gas, such as $C_5F_8$ or $C_4F_8$, or carbon monoxide (CO) with $O_2$ gas and an inert gas such as Ar. In some embodiments according to the invention, the etching process is performed at an RF power in a range between about 1000 Watts and about 2000 Watts at a pressure in a range between about of 10 mTorr and about 100 mTorr and a temperature in a range between about 0° C. and about 60° C., for a time in a range between about 5 seconds and about 30 seconds, and preferably, for about 15 seconds. If a stopper layer has been formed on the integrated circuit substrate 100, the stopper layer is also etched using the hard mask pattern 104 as a mask.

The exposed portion of the integrated circuit substrate 100 is cleaned. This cleaning process is performed to reduce contact resistance between the integrated circuit substrate 100 and a pad or a contact plug. At this time, a standard cleaning 1 cleaner (mixed liquid of ammonium hydroxide, peroxide and deionized water) or a diluted HF solution is used. Preferably, the cleaning process is performed at a temperature in a range between about 20° C. and about 80° C. for a time in a range between about 2 minutes and about 20 minutes.

A conductive layer is deposited on a gap between SOG layer patterns 102b, thereby forming a pad or a contact plug for electrically connecting the integrated circuit substrate 100 with upper metal layers or contacts. In some embodiments according to the invention, the conductive layer may be a polysilicon layer.

In method embodiments according to the invention, a first curing process is performed on the SOG layer, the SOG layer is patterned not to the extent that the lower part of the SOG layer having a predetermined height can be etched and then, a second curing process is performed, so that the lower part of the SOG layer can be sufficiently cured. Therefore, it is possible to address the problems of the prior art in which the profile of a SOG layer pattern is inferior because the lower part of the SOG layer (which is not sufficiently cured) is etched rapidly in a cleaning process. In addition, it is possible to prevent contact failure introduced by the inferior profile of the SOG layer pattern and oxidation of metal interconnections caused by absorption of moisture or outgasing.

It should be noted that many variations and modifications can be made to the embodiments described above without substantially departing from the principles of the present invention. All such variations and modifications are intended to be included herein within the scope of the present invention, as set forth in the following claims.

What is claimed:

1. A method of forming a Spin-On-Glass (SOG) layer in an integrated circuit, the method comprising:

forming an SOG layer on an integrated circuit substrate;

performing a first curing process on the SOG layer;

removing less than all of the SOG layer from the integrated circuit substrate through a mask pattern on the SOG layer to provide a remaining portion of the SOG layer on the integrated circuit substrate;

performing a second curing process on the remaining portion of the SOG layer; and removing the remaining portion of the SOG layer to expose the integrated circuit substrate.

2. A method according to claim 1 wherein said step of removing comprises:

etching the SOG layer through the mask pattern to form a recess in the SOG layer, wherein the recess has a bottom formed of the SOG layer that is spaced-apart from the integrated circuit substrate by a thickness of the bottom.

3. A method according to claim 2 wherein etching is performed using a C—F based gas, CO gas, $O_2$ gas and an inert gas as etching gas, reaction gas and atmospheric gas, respectively.

4. A method according to claim 2 wherein etching is performed at an RF power in a range between about 1000 Watts and about 2000 Watts at a pressure in a range between about 10 mTorr and about 100 mTorr and a temperature in a range between about 0° C. and about 60° C. for a time in a range between about 20 second and about 50 seconds.

5. A method according to claim 2 wherein etching is performed using at an RF power in a range between about 1000 Watts and about 2000 Watts at a pressure in a range between about 10 mTorr and about 100 mTorr and a temperature in a range between about 0° C. and about 60° C. for a time in a range between about 5 second and about 30 seconds.

6. A method according to claim 2 wherein forming an SOG layer comprises:

forming a stopper layer on the integrated circuit substrate on which a predetermined pattern has been formed; and forming the SOG layer on the stopper layer, wherein the stopper layer is etched using the mask pattern after etching the SOG layer.

7. A method according to claim 6 wherein the stopper layer comprises a silicon nitride layer ($Si_3N_4$), an aluminum oxide layer $Al_2O_3$, an aluminum nitride layer AlN, a titanium nitride layer TiN or a tantalum nitride layer (TaN).

8. A method according to claim 2 wherein said step of etching the bottom is followed by:

cleaning the integrated circuit substrate; and forming a conductive layer in the recess on the integrated circuit substrate.

9. A method according to claim 1 wherein said step of performing the first curing process comprises performing the first curing process at a temperature in a range between about 600° C. and about 800° C. for a time in a range between about 20 minutes and about 2 hours.

10. A method according to claim 1 wherein said step of performing the second curing process comprises performing the second curing process at a temperature in a range of between about 400° C. and about 800° C. for a time in a range of between about 10 minutes and about 1 hour.

11. A method according to claim 1 wherein the first and second curing processes are performed using $H_2O$, $O_2$, $N_2$, $H_2$, $NO_2$ or a mixture of these gases as an atmospheric gas.

12. A method according to claim 1 wherein the remaining portion has a thickness that is adequate to prevent oxidation of the integrated circuit substrate during the second curing process.

13. A method according to claim 12 wherein the thickness is in a range between about 300 Ångstroms and about 500 Ångstroms.

14. A method according to claim 1 wherein the mask pattern is formed of a polysilicon layer, an aluminum oxide layer ($Al_2O_3$), an aluminum nitride layer (AlN) or a silicon nitride layer ($Si_3N_4$).

* * * * *